United States Patent
Ishikawa

(10) Patent No.: US 10,651,322 B2
(45) Date of Patent: May 12, 2020

(54) SOLAR CELL ELEMENT AND SOLAR CELL MODULE

(71) Applicant: KYOCERA CORPORATION, Kyoto (JP)

(72) Inventor: Shinya Ishikawa, Higashiomi (JP)

(73) Assignee: KYOCERA CORPORATION, Kyoto (JP)

( * ) Notice: Subject to any disclaimer, the term of this patent is extended or adjusted under 35 U.S.C. 154(b) by 0 days.

(21) Appl. No.: 16/089,330

(22) PCT Filed: Mar. 28, 2017

(86) PCT No.: PCT/JP2017/012602
§ 371 (c)(1),
(2) Date: Sep. 27, 2018

(87) PCT Pub. No.: WO2017/170529
PCT Pub. Date: Oct. 5, 2017

(65) Prior Publication Data
US 2019/0081186 A1 Mar. 14, 2019

(30) Foreign Application Priority Data

Mar. 30, 2016 (JP) ................. 2016-068921

(51) Int. Cl.
*H01L 31/0216* (2014.01)
*H01L 31/068* (2012.01)
*H01L 31/0224* (2006.01)
*H01L 31/18* (2006.01)
*H01L 31/05* (2014.01)

(52) U.S. Cl.
CPC ...... *H01L 31/0216* (2013.01); *H01L 31/0224* (2013.01); *H01L 31/02167* (2013.01); *H01L 31/022425* (2013.01); *H01L 31/05* (2013.01); *H01L 31/068* (2013.01); *H01L 31/18* (2013.01); *H01L 31/1804* (2013.01); *Y02E 10/50* (2013.01); *Y02P 70/521* (2015.11)

(58) Field of Classification Search
CPC .. H01L 31/0216; H01L 31/0224; H01L 31/18
See application file for complete search history.

(56) References Cited

U.S. PATENT DOCUMENTS

2011/0143486 A1 6/2011 Hama

FOREIGN PATENT DOCUMENTS

WO 2009/157079 A1 12/2009

*Primary Examiner* — Tae-Sik Kang
(74) *Attorney, Agent, or Firm* — Duane Morris LLP

(57) ABSTRACT

A solar cell element comprises a semiconductor substrate, a passivation layer, and first to third electrodes. The passivation layer with first holes is located on the semiconductor substrate. The first electrode is located in each of the first holes and electrically connected to the semiconductor substrate. The second electrode is electrically connected to the first electrode and located on the passivation layer. The third electrodes is electrically connected to the first electrode via the second electrode. The passivation layer includes a part where a ratio of an area occupied by the first holes in a first region adjacent to the third electrodes is smaller than a ratio of an area occupied by the first holes in a second region located farther away from the third electrodes in relation to the first region and having an area equal to an area of the first region in a perspective plan view.

7 Claims, 11 Drawing Sheets

F I G . 3
III-III
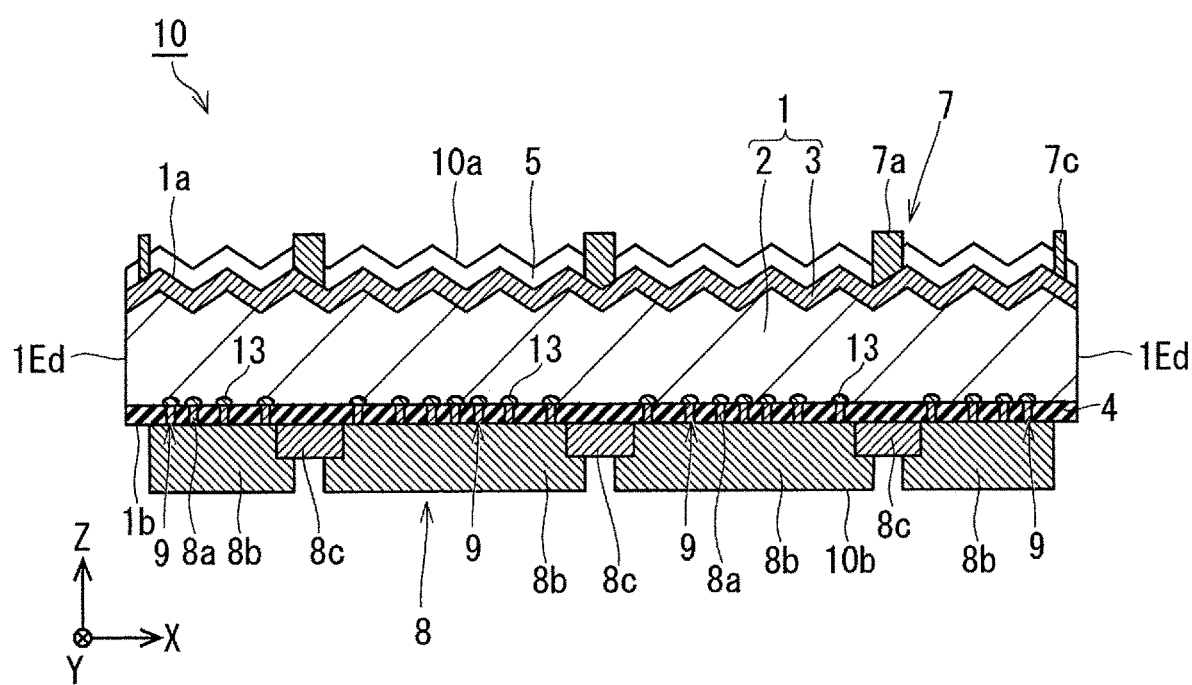

F I G. 4
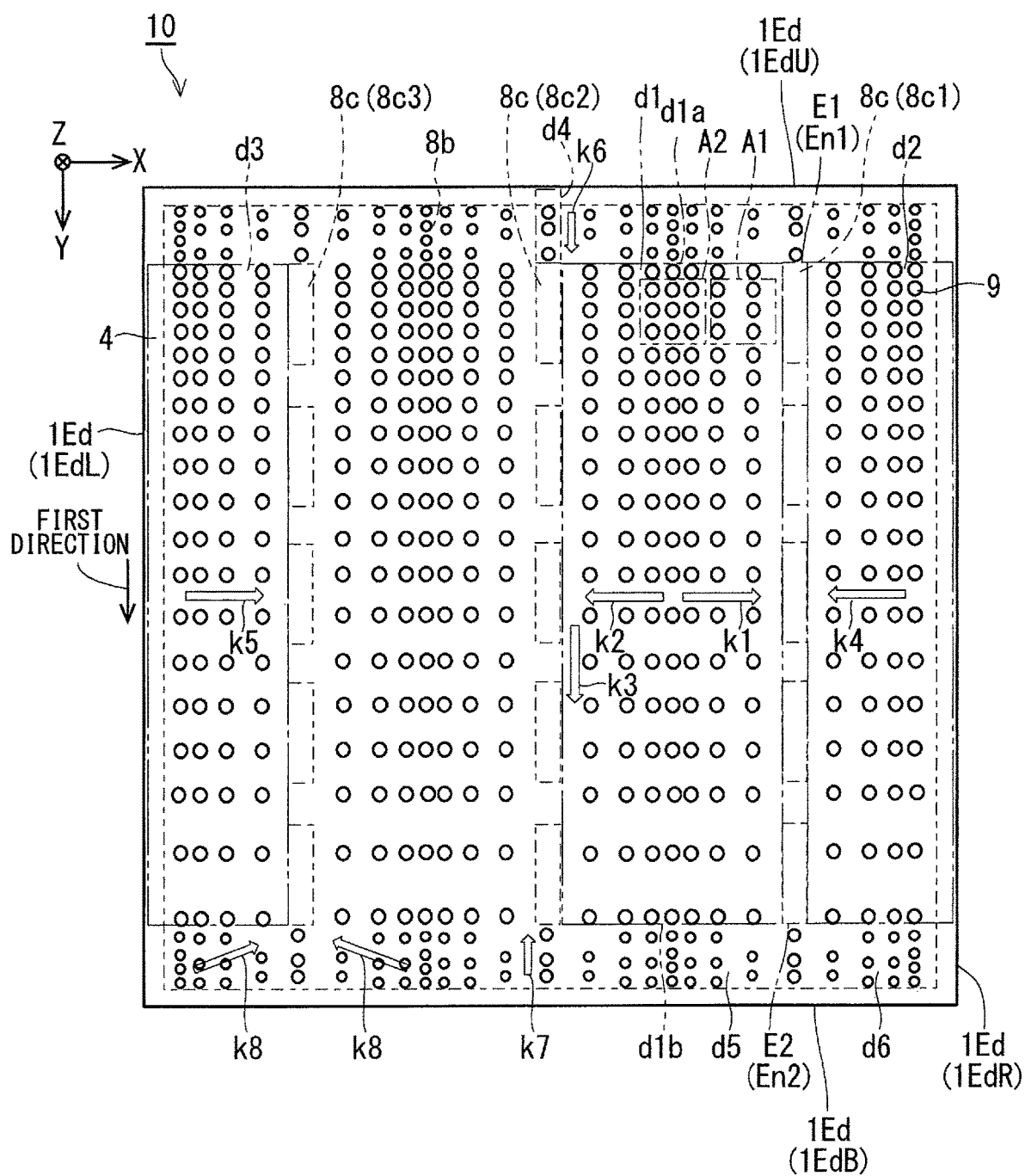

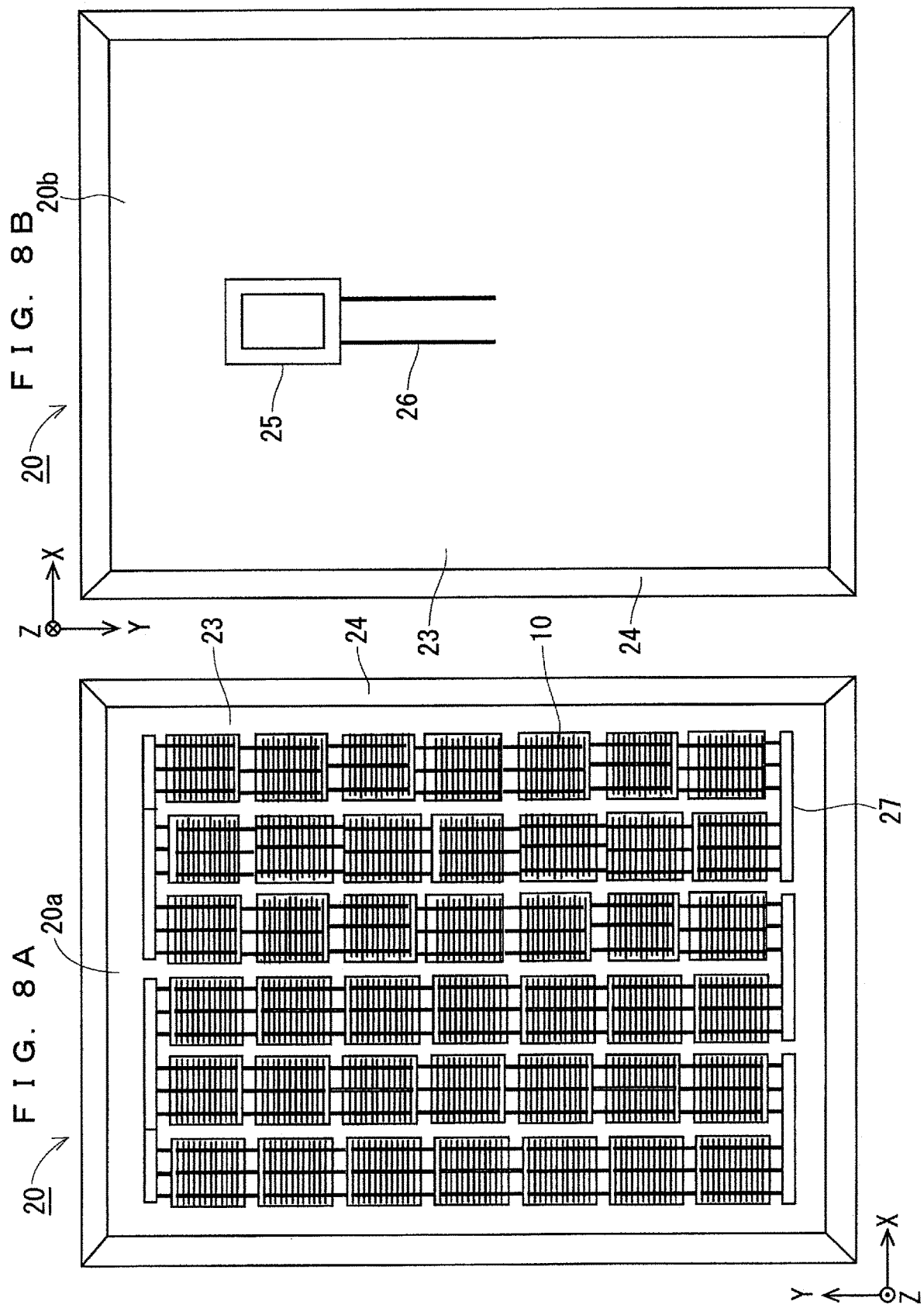

SOLAR CELL ELEMENT AND SOLAR CELL MODULE

CROSS-REFERENCE TO RELATED APPLICATION

The present application is a National Phase entry based on PCT Application No. PCT/JP2017/012602 filed on Mar. 28, 2017, entitled "SOLAR CELL ELEMENT AND SOLAR CELL MODULE" which claims the benefit of Japanese Patent Application No. 2016-068921, filed on Mar. 30, 2016, entitled "SOLAR CELL ELEMENT AND SOLAR CELL MODULE", the contents of which are incorporated by reference herein in their entirety.

TECHNICAL FIELD

Embodiments of the present disclosure relate to a solar cell element and a solar cell module.

BACKGROUND

Known as one structure of solar cells (also referred to as solar cell elements) capable of increasing photoelectric conversion efficiency is a passivated emitter and rear cell (PERC) structure.

A solar cell element having the PERC structure comprises, for example, a passivation layer on a rear surface of a silicon substrate. The solar cell element further comprises an electrode located to pass through the passivation layer and a back surface electrode located on a substantially entire surface on a rear surface side of the silicon substrate.

SUMMARY

A solar cell element and a solar cell module are disclosed.

In one embodiment, a solar cell element comprises a semiconductor substrate, a passivation layer, a first electrode, a second electrode, and one or more third electrodes. The passivation layer is located on the semiconductor substrate and has a plurality of first holes. The first electrode is located in each of the plurality of first holes and electrically connected to the semiconductor substrate. The second electrode is electrically connected to the first electrode and located on the passivation layer. The one or more third electrodes are electrically connected to the first electrode via the second electrode and located to linearly extend in a first direction. The passivation layer includes a part where a ratio of an area occupied by the plurality of first holes in a first region adjacent to the one or more third electrodes is smaller than a ratio of an area occupied by the plurality of first holes in a second region located farther away from the one or more third electrodes in relation to the first region and having an area equal to an area of the first region in a perspective plan view.

In one embodiment, a solar cell module comprises one embodiment of the solar cell element and a connection tab being located to extend toward the first direction on the one or more third electrodes.

BRIEF DESCRIPTION OF DRAWINGS

FIG. 3 illustrates an end view showing one example of an end surface of the solar cell element taken along a line III-III of FIG. 1 and FIG. 2.

FIG. 4 illustrates a perspective plan view showing a distribution of first holes in a passivation layer according to the first embodiment.

FIG. 8A illustrates a plan view showing one example of an external appearance of a solar cell module on a first module surface side according to the first embodiment. FIG. 8B illustrates a plan view showing one example of the external appearance of the solar cell module on a second module surface side according to the first embodiment.

DETAILED DESCRIPTION

Figure 1:
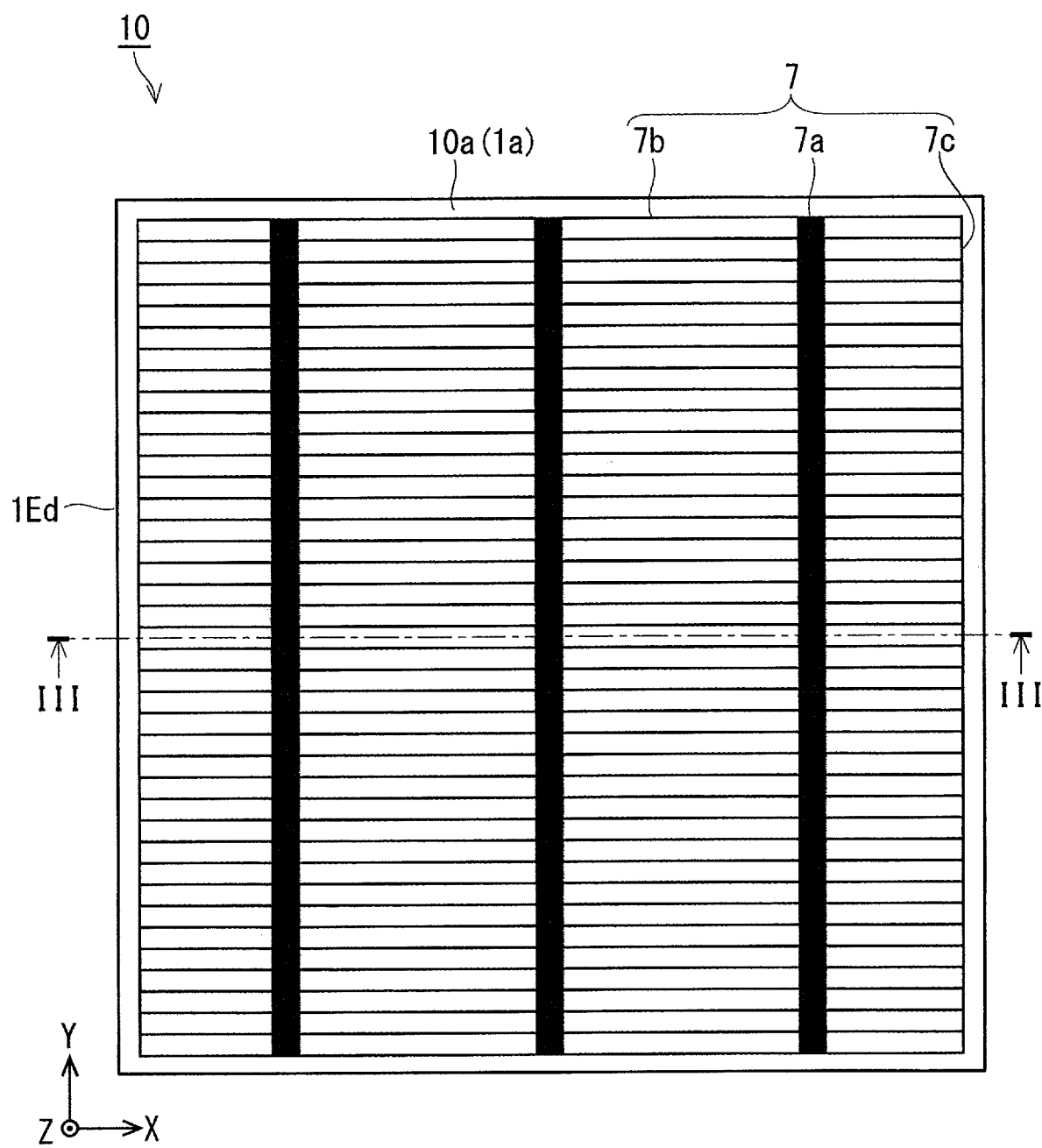
FIG. 1 illustrates a plan view showing one example of an external appearance of a solar cell element on a front surface side according to a first embodiment.

Each embodiment is described hereinafter based on the drawings. In the drawings, components having similar configuration and function are denoted by the same reference symbols, and overlapping description will be omitted in the description below. The drawings are schematically illustrated, and therefore some of constituent elements are omitted in some cases. An XYZ coordinate system of a right-handed system is depicted in FIG. 1 to FIG. 12. In this XYZ coordinate system, a direction along one side of a solar cell element 10 is a +X direction, a direction along the other side intersecting with the one side is a +Y direction, and a direction perpendicular to both the +X direction and the +Y direction is a +Z direction.

1. First Embodiment

1-1. Solar Cell Element

Figure 2:
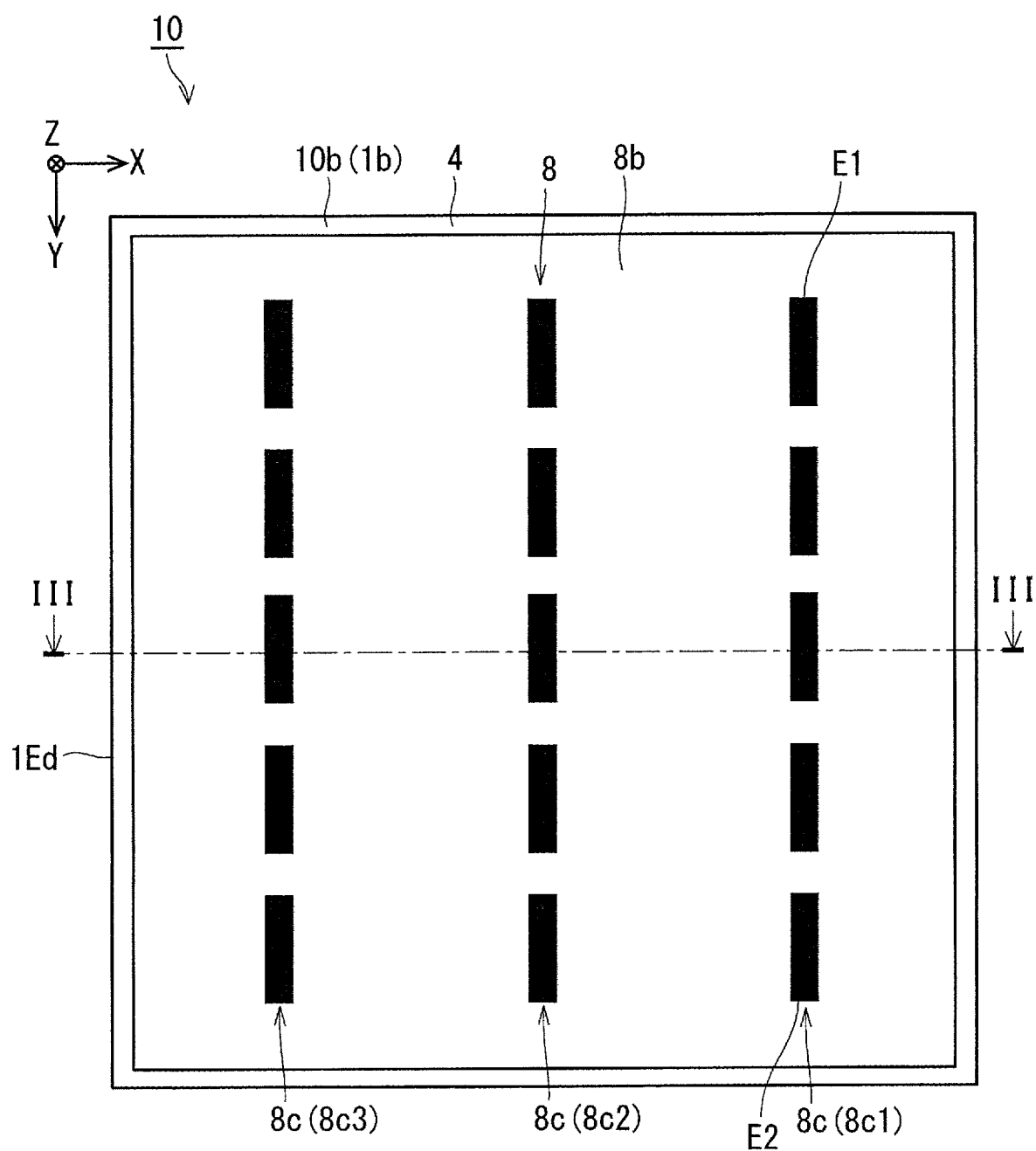
FIG. 2 illustrates a plan view showing one example of the external appearance of the solar cell element on a back surface side according to the first embodiment.

As illustrated in FIG. 1 to FIG. 3, the solar cell element 10 includes a front surface 10a located on a front side from which mainly light enters and a back surface 10b located on an opposite side (back side) of the front surface 10a.

A semiconductor substrate (also referred to as a substrate) 1 used for the solar cell element 10 also includes a first surface 1a and a second surface 1b located on an opposite side of the first surface 1a. The substrate 1 includes a first semiconductor layer 2 as a semiconductor region of a first conductivity type (e.g., a p-type) and a second semiconductor layer 3 located on a first surface 1a side of the first semiconductor layer 2 as a semiconductor region of a second conductivity type (e.g., an n-type).

One example of the solar cell element 10 in which a p-type polycrystalline silicon or a p-type monocrystalline silicon is used as the substrate 1 (or the first semiconductor layer 2) is described hereinafter.

The substrate 1 has a thickness of approximately 100 μm to 250 μm, for example. If the substrate 1 has a substantially quadrilateral shape formed of sides each ranging from approximately 150 mm to 200 mm in a plan view, a solar cell module 20 (refer to FIG. 8A and FIG. 8B) in which a large number of the solar cell elements 10 each having the substrate 1 are arrayed can be easily manufactured. However, a planar shape and size of the substrate 1 is not limited. Herein, for example, if a p-type impurity such as boron and/or gallium is contained as a dopant element in a silicon substrate, the first semiconductor layer 2 which is the p-type semiconductor region can be generated.

The second semiconductor layer 3 is located on the first semiconductor layer 2. The second semiconductor layer 3 is a semiconductor layer of the second conductivity type (an n-type in the first embodiment) opposite to the first conductivity type of the first semiconductor layer 2. A pn junction part is therefore formed between the first semiconductor layer 2 the second semiconductor layer 3. The second semiconductor layer 3 can be formed if an n-type impurity such as phosphorus as a dopant element is contained in the first surface 1a side of the substrate 1, for example.

As illustrated in FIG. 3, the first surface 1a in the substrate 1 includes a minute concave-convex structure (a texture) for reducing a reflection ratio of emitted light. Accordingly, a reflection of light can be reduced on the first surface 1a side of the substrate 1. For example, a height of each protrusion of the texture ranges approximately from 0.1 μm to 10 μm. The distance between apexes of the adjacent protrusions of the texture ranges approximately from 0.1 μm to 20 μm for example.

The solar cell element 10 comprises an antireflection layer 5 and a surface electrode 7 on the front surface 10a side. The solar cell element 10 further comprises a back surface electrode 8 and a passivation layer 4 on a back surface 10b side.

The antireflection layer 5 can reduce the reflection ratio of the light emitted to the front surface 10a of the solar cell element 10. Accordingly, photoelectric conversion efficiency of the solar cell element 10 can be increased. The antireflection layer 5 can be made up of an insulating layer of silicon oxide, aluminum oxide, a silicon nitride or the like or a laminated layer of those insulating layers, for example. As a refractive index and a thickness of the antireflection layer 5, for example, a refractive index and a thickness that allow light out of sunlight within such a wavelength range that is absorbed into the substrate 1 and can thus contribute to power generation to satisfy low reflection conditions may be adopted. If the antireflection layer 5 of silicon nitride is formed by a plasma enhanced chemical vapor deposition (PECVD) method, for example, the antireflection layer 5 having a refractive index of approximately from 1.8 to 2.5, and a thickness of approximately from 60 nm to 120 nm can be achieved.

As illustrated in FIG. 1, the surface electrode 7 is an electrode located on the first surface 1a side of the substrate 1. The surface electrode 7 includes, for example, a plurality of bus bar electrodes 7a (three in the example in FIG. 1) and a plurality of linear finger electrodes 7b (forty in the example in FIG. 1).

The bus bar electrodes 7a are linearly located in the Y direction in the example in FIG. 1. The bus bar electrodes 7a are electrodes for outputting electricity obtained by a photoelectric conversion in the substrate 1 to an outer side of the solar cell element 10, for example. Each of the bus bar electrodes 7a has a width of approximately 1 mm to 3 mm, for example. At least a part of the bus bar electrodes 7a is electrically connected to the finger electrodes 7b at a substantially right angle with the finger electrodes 7b.

The finger electrodes 7b can collect a carrier generated in accordance with incoming light in the substrate 1 and transmit the carrier to the bus bar electrodes 7a. Each of the finger electrodes 7b is located to extend in the X direction. Each of the finger electrodes 7b has a width of approximately 30 μm to 200 μm, for example. The plurality of finger electrodes 7b are located at an interval of approximately 1 mm to 3 mm therebetween. Herein, the surface electrode 7 may further include sub-finger electrodes 7c located along the Y direction of a peripheral edge part 1Ed of the substrate 1 on the first surface 1a side of the substrate 1, having a shape similar to that of the finger electrodes 7b, thereby electrically connecting the plurality of the finger electrodes 7b to each other, for example.

The surface electrode 7 can be formed by applying a conductive paste containing silver as a main component into a desired shape with screen printing or the like, and then performing sintering on the conductive paste, for example. Herein, the main component indicates a component whose content ratio to a whole component is equal to or larger than 50% by mass. Also in the description hereinafter, the main component indicates the meaning similar to the above description. The surface electrode 7 formed by performing the sintering on the conductive paste has a thickness of approximately 7 μm to 40 μm, for example.

The passivation layer 4 is located on substantially the whole second surface 1b of the substrate 1. The passivation layer 4 has a plurality of first holes 9. Herein, each first hole 9 is located to pass through the passivation layer 4 in a thickness direction. The passivation layer 4 can reduce a defect level at an interface between the substrate 1 and the passivation layer 4, and can reduce a recombination of minority carriers near the interface. The passivation layer 4 can be made up of an insulating layer of silicon oxide, aluminum oxide, a silicon nitride or the like or a laminated layer of those insulating layers, for example. The passivation layer 4 has a thickness of approximately 6 nm to 100 nm, for example. In the first embodiment, if the first semiconductor layer 2 has the p-type conductivity, a layer such as an aluminum oxide layer, for example, having a negative fixed charge may be used as the passivation layer 4. Herein, if the passivation layer 4 having the negative fixed charge is adopted, for example, electrons, which are minority carriers, are brought away from the interface between the substrate 1 and the passivation layer 4 due to an electric field effect of the passivation layer 4. Accordingly, the recombination of minority carriers is reduced near the interface between the substrate 1 and the passivation layer 4.

The passivation layer 4 made of aluminum oxide can be formed on substantially the whole second surface 1b by atomic layer deposition (ALD) method, for example. Furthermore, the first hole 9 can be formed in an optional position in the passivation layer 4 by irradiating the passivation layer 4 with a laser beam using a YAG (yttrium aluminum garnet) laser device.

As illustrated in FIG. 2 and FIG. 3, the back surface electrode 8 is an electrode located on a second surface 1b side of the substrate 1. The back surface electrode 8 includes a first electrode 8a, a second electrode 8b, and a third electrode 8c, for example.

The first electrode 8a is located in the first hole 9 in the passivation layer 4. As illustrated in FIG. 3, the first electrode 8a is located in a through hole of each of the plurality of first holes 9. That is to say, there are the plurality of first electrodes 8a. Each first electrode 8a is electrically connected to the substrate 1. For example, one end of the first electrode 8a is in direct contact with the second surface 1b of the substrate 1. The one end needs to be located on a substrate 1 side of the first electrode 8a in a passing-through direction of the first hole 9. The first electrode 8a can thereby collect the carriers in the second surface 1b of the substrate 1. The other one end of the first electrode 8a is electrically connected to the second electrode 8b. The other one end needs to be located on an opposite side of the substrate 1 in the first electrode 8a in the passing-through direction of the first hole 9. The carriers collected by the first electrode 8a can be thereby transmitted to the second electrode 8b. Herein, a cross-sectional shape of the first electrode 8a may be any of a circular shape, an oval shape, or a rectangular shape, or a band-like shape (linear shape), for example, in a perspective plan view of the back surface 10b. The first electrode 8a may have a diameter (or a width) of, for example, approximately 60 μm to 500 μm.

The second electrode 8b is located on the passivation layer 4. The second electrode 8b is electrically connected to both the first electrode 8a and the third electrode 8c. The second electrode 8b can transmit the carriers collected by the first electrode 8a to the third electrode 8c. Thus, the second electrode 8b is formed on substantially the whole second surface 1b except for a peripheral edge and a part of a region where the third electrode 8c is formed in the second surface 1b to cover almost all of the first electrodes 8a, for example.

The first electrode 8a and the second electrode 8b can be formed in the following manner, for example. Firstly, a conductive paste containing aluminum as a main component is applied on the passivation layer 4 having the first holes 9 by screen printing or the like. At this time, the conductive paste enters the first holes 9, thereby also being located on the passivation layer 4. Then, the conductive paste is sintered to form the first electrode 8a and the second electrode 8b. Herein, a layer thickness of the first electrode 8a is equal to that of the passivation layer 4. The second electrode 8b has a thickness of approximately 15 μm to 50 μm, for example.

Herein, if the first electrode 8a is formed using a conductive paste containing aluminum, for example, a back surface field (BSF) layer 13 is formed in the substrate 1. For example, after the conductive paste containing aluminum is applied on the passivation layer 4, the conductive paste is sintered with a predetermined temperature profile having a maximum temperature equal to or higher than a melting point of aluminum. The first electrode 8a is thereby formed, and an interdiffusion of elements occurs between aluminum in the conductive paste and the substrate 1. As a result, the BSF layer 13 containing higher concentration of aluminum than that of the first semiconductor layer 2 is formed in the substrate 1. Herein, since aluminum can be a p-type dopant, the concentration of the dopant contained in the BSF layer 13 is higher than that of the dopant contained in the first semiconductor layer 2. As described above, the BSF layer 13 contains first conductivity type dopant elements at a higher concentration than that of first conductivity type dopant element in the first semiconductor layer 2. The BSF layer 13 foal's an internal electric field on the second surface 1b side of the substrate 1. Thus, the recombination of the minority carriers can be reduced near the surface of the second surface 1b in the substrate 1. As a result, the photoelectric conversion efficiency of the solar cell element 10 is hardly reduced. The BSF layer 13 can be formed if dopant elements such as boron or aluminum are contained, through diffusion, in a surface layer portion on the second surface 1b side of the substrate 1, for example. A concentration of the dopant elements contained in the first semiconductor layer 2 is set to approximately $5 \times 10^{15}$ atoms/cm$^3$ to $1 \times 10^{17}$ atoms/cm$^3$, for example. A concentration of the dopant elements contained in the BSF layer 13 is set to approximately $1 \times 10^{18}$ atoms/cm$^3$ to $5 \times 10^{21}$ atoms/cm$^3$, for example.

The third electrode 8c is located on the second surface 1b of the substrate 1. The third electrode 8c is electrically connected to the first electrode 8a via the second electrode 8b. The third electrode 8c is located in a position facing the bus bar electrodes 7a with the substrate 1 therebetween. Herein, each of N or more (N indicates a natural number) third electrodes 8c is located to linearly extend toward a first direction (the +Y direction in the example in FIG. 2). The third electrodes 8c are electrodes for outputting electricity obtained by the photoelectric conversion in the substrate 1 to the outer side of the solar cell element 10, for example. The third electrodes 8c are located on the passivation layer 4 not to overlap with the first electrodes 8a in a plan view, or linearly located in a state of passing through the passivation layer 4. Each of the third electrodes 8c has a thickness of approximately 5 μm to 30 μm and a width of approximately 1 mm to 7 mm, for example. Herein, the plurality of third electrodes 8c may be located side by side toward a second direction (the +X direction in the example in FIG. 2) perpendicular to the first direction as illustrated in FIG. 2, for example. Accordingly, current generated by the photoelectric conversion in the substrate 1 can be dispersedly output to the outer side of the solar cell element 10, for example. As a result, a serial resistance component in the solar cell element 10 can be reduced.

Each third electrode 8c may include a plurality of island shaped portions linearly arranged toward the +Y direction as illustrated in FIG. 2. Each third electrode 8c may have a shape to be sequentially formed in a linear region located from an end on a Y direction side to an end on a +Y direction side on the second surface 1b of the substrate 1, similarly to the shape of the bus bar electrode 7a. However, if the third electrode 8c includes the plurality of island shaped portions, the first electrode 8a or the passivation layer 4 and the second electrode 8b can be located between the plurality of island shaped portions in a perspective plan view of the back surface 10b. Accordingly, the photoelectric conversion efficiency of the solar cell element 10 can be increased. The second electrode 8b may overlap with a peripheral part of the third electrode 8c, for example, in a perspective plan view of the back surface 10b. The third electrode 8c may include a rectangular main body of an electrode and a protruding part located to protrude from the main body, for example. In this case, if the protruding part is covered by the second electrode 8b, the third electrode 8c and the second electrode 8b can be electrically connected to each other. If the third electrode 8c contains silver or copper which can be soldered as a main component, a connection tab which is a ribbon-like connected conductor can be easily connected to the third electrode 8c in a process of manufacturing a solar cell module. The third electrode 8c can be formed by applying a conductive paste containing silver as a main component into a desired shape with screen printing or the like, and then performing sintering on the conductive paste, for example.

Next, a function of the solar cell element 10 according to the first embodiment is described. In the solar cell element 10 according to the first embodiment, the passivation layer 4 includes a part where a ratio of an area occupied by the plurality of first holes 9 in a first region A1 is smaller than a ratio of an area occupied by the plurality of first holes 9 in a second region A2 in a perspective plan view as illustrated in FIG. 4. Herein, the first region A1 is a region adjacent to the third electrode 8c in a perspective plan view. The second region A2 is a region located farther away from the third electrode 8c in relation to the first region A1 and having an area equal to that of the first region A1 in a perspective plan view.

When the first electrode 8a and the second electrode 8b are formed by performing the sintering on the conductive paste containing a metal, a component in the substrate 1 (e.g., silicon) is diffused in the first electrode 8a and the second electrode 8b, for example. The component in the substrate 1 is diffused more easily as the thicknesses of the first electrode 8a and the second electrode 8b are smaller. If the component is diffused in such a manner, the metal component in the first electrode 8a and the second electrode 8b and the component in the substrate 1 react to each other, and a region having high electrical resistance (also referred to as a high resistance region) is formed near the first hole 9. Thus, in the solar cell element 10 according to the first embodiment, the plurality of first holes 9 are distributed so that there is the part where the ratio of the area occupied by the plurality of first holes 9 in the first region A1 is smaller than the ratio of the area occupied by the plurality of first holes 9 in the second region A2 in a perspective plan view of the back surface 10b. Accordingly, a serial resistance component in an equivalent circuit in the solar cell element 10 according to the first embodiment can be reduced. As a result, the photoelectric conversion efficiency of the solar cell element 10 can be increased.

Figure 5A:
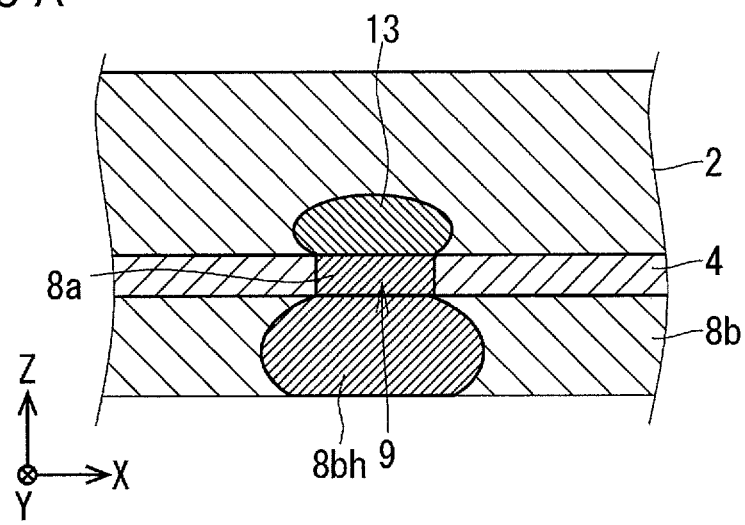
FIG. 5A illustrates an enlarged end view schematically showing a portion near a first electrode of the solar cell element according to the first embodiment.
Figure 5B:
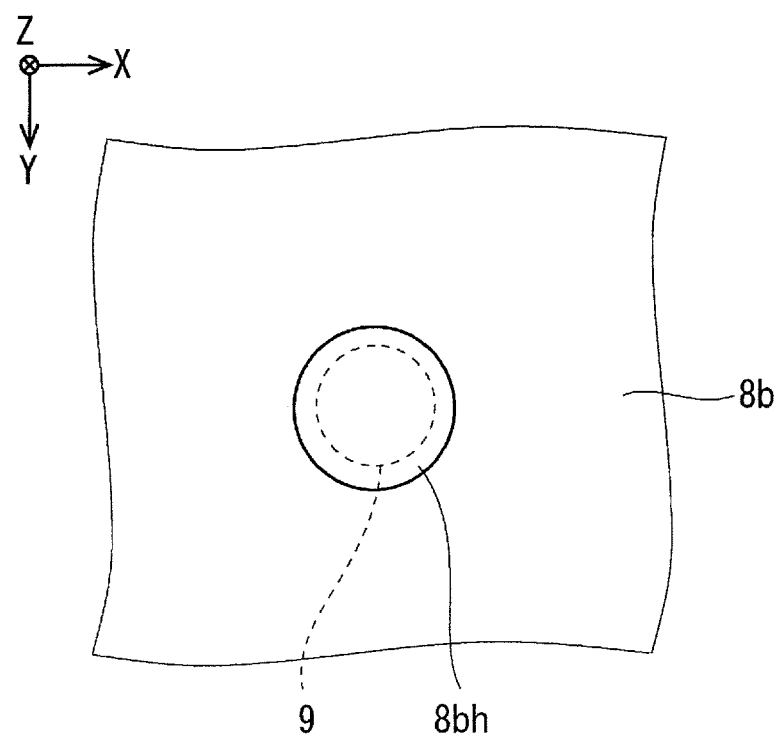
FIG. 5B illustrates an enlarged plan view schematically showing the portion near the first electrode of the solar cell element according to the first embodiment.

Particularly if there is the BSF layer 13 as described above, the semiconductor component such as silicon is diffused in the second electrode 8b when the BSF layer 13 is formed in the substrate 1 as illustrated in FIG. 5A. A part 8bh containing an alloy of silicon and aluminum and having high electrical resistance (also referred to as a high resistance part) is thereby formed in the second electrode 8b. The high resistance part 8bh in the second electrode 8b is larger than the first electrode 8a. Thus, as illustrated in FIG. 5B, a plane area of the high resistance part 8bh is larger than that of the first hole 9 in a perspective plan view of the back surface 10b. In the solar cell element 10, if an intensity distribution of received light is even, the carrier can be generated almost evenly by the photoelectric conversion except for a position where the surface electrode 7 is formed. However, a flow of the carrier is directed toward the third electrode 8c for outputting the current. At this time, a current density shows a tendency to increase with a decreasing distance to the third electrode 8c.

Thus, in the first embodiment, a contact area between the plurality of first electrodes 8a and the second electrodes 8b per unit area decreases with the decreasing distance to the third electrode 8c in a perspective plan view of the back surface 10b. That is to say, the passivation layer 4 includes the part where the ratio of the area occupied by the plurality of first holes 9 per unit area decreases with the decreasing distance to the third electrode 8c in a part between the adjacent third electrodes 8c in a perspective plan view of the back surface 10b. Assumed specifically is a case where the N third electrodes 8c includes a primary third electrode 8c1, a secondary third electrode 8c2, and a tertiary third electrode 8c3 arranged from the +X direction side toward the X direction side as illustrated in FIG. 2. In this case, in the passivation layer 4, as illustrated in FIG. 4, the ratio of the area occupied by the plurality of first holes 9 decreases with the decreasing distance to the primary third electrode 8c1 or the secondary third electrode 8c2 in the part between the primary third electrode 8c1 and the secondary third electrode 8c2 adjacent to each other in a perspective plan view of the back surface 10b. In the passivation layer 4, the ratio of the area occupied by the plurality of first holes 9 decreases with the decreasing distance to the secondary third electrode 8c2 or the tertiary third electrode 8c3 in the part between the secondary third electrode 8c2 and the tertiary third electrode 8c3 adjacent to each other in a perspective plan view of the back surface 10b. That is to say, there is a region where the contact area between the plurality of first electrodes 8a and the second electrodes 8b per unit area decreases with the decreasing distance to the third electrode 8c in the part between the adjacent third electrodes 8c in a perspective plan view of the back surface 10b, for example. Accordingly, a ratio of an area occupied by the high resistance parts 8bh per unit area decreases in a region where the current density relatively increases, for example. As a result, the serial resistance component in the equivalent circuit in the solar cell element 10 can be reduced, for example. Accordingly, the photoelectric conversion efficiency of the solar cell element 10 can be increased.

Described hereinafter is a configuration example which can further increase the photoelectric conversion efficiency of the solar cell element 10.

As described above, as illustrated in FIG. 4, the passivation layer 4 includes a part where the ratio of the area occupied by the plurality of first holes 9 in the first region A1 adjacent to the third electrode 8c is smaller than the ratio of the area occupied by the plurality of first holes 9 in the second region A2 located farther away from the third electrode 8c in relation to the first region A1 and having the area equal to that of the first region A1 in a perspective plan view.

In the solar cell element 10, for example, a region d1 is located between a region where the primary third electrode 8c1 is located and a region where the secondary third electrode 8c2 adjacent to the region of the primary third electrode 8c1 is located in a perspective plan view of the back surface 10b. In the region d1, the carrier generated by the photoelectric conversion in the substrate 1 moves toward the third electrode 8c located nearest in the ±X direction. Thus, in the region d1, the current density may increase from a central part of the region d1 in the +X direction toward a k1 direction (the +X direction) and a k2 direction (the −X direction). In contrast, as illustrated in FIG. 4, if the size of each first hole 9 is the same in a perspective plan view of the back surface 10b, for example, a distance between centers of the adjacent first holes 9 is reduced to maximize the number of the first holes 9 per unit area near the central part of the region d1 in the +X direction. In other words, for example, the ratio of the area occupied by the plurality of first holes 9 per unit area is the largest near the central part of the region d1 in the +X direction in a perspective plan view of the back surface 10b. For example, the distance between the centers of the adjacent first holes 9 is increased so that the first holes 9 are distributed sparsely in increments or in stages toward the k1 direction (the +X direction) and the k2 direction (the −X direction) from the central part of the region d1 in the +X direction as a boundary in the region d1 in a perspective plan view of the back surface 10b. Accordingly, the serial resistance component in the equivalent circuit in the solar cell element 10 can be reduced, for example. As a result, the photoelectric conversion efficiency of the solar cell element 10 can be increased. Herein, in a perspective plan view of the back surface 10b, for example, the description of "toward the k1 direction (the +X direction) in the region d1" indicates "closer to the region where the primary third electrode 8c1 is located in the region d1". For example, in a perspective plan view of the back surface 10b, the description of "toward the k2 direction (the −X direction) in the region d1" indicates "closer to the region where the secondary third electrode 8c2 is located in the region d1".

A region d2 is located between a peripheral edge part (also referred to as a right peripheral edge part) 1EdR located in a +X direction side of the substrate 1 and a region where the primary third electrode 8c1 is located in a perspective plan view of the back surface 10b, for example. In the region d2, the distance between the centers of the adjacent first holes 9 may be reduced to maximize the number of the first holes 9 per unit area on a right peripheral edge part 1EdR side, for example. That is to say, for example, the ratio of the area occupied by the plurality of first holes 9 per unit area may be the largest on the right peripheral edge part 1EdR side of the region d2 in a perspective plan view of the back surface 10b. In this case, the distance between the centers of the adjacent first holes 9 may be increased so that the first holes 9 are distributed sparsely in increments or in stages toward a k4 direction (the −X direction) from the right peripheral edge part 1EdR side in a perspective plan view of the back surface 10b, for example. Herein, for example, in a perspective plan view of the back surface 10b, the description of "toward the k4 direction (the −X direction) from the right peripheral edge part 1EdR side in the region d2" indicates "closer to the region where the primary third electrode 8c1 is located in the region d2".

Similarly, a region d3 is located between a peripheral edge part (also referred to as a left peripheral edge part) 1EdL located in a −X direction side of the substrate 1 and a region where the tertiary third electrode 8c3 is located in a perspective plan view of the back surface 10b, for example. Also in the region d3, the distance between the centers of the adjacent first holes 9 may be reduced to maximize the number of the first holes 9 per unit area on a left peripheral edge part 1EdL side, for example. That is to say, for example, the ratio of the area occupied by the plurality of first holes 9 per unit area may be the largest on the left peripheral edge part 1EdL side of the region d3 in a perspective plan view of the back surface 10b. In this case, the distance between the centers of the adjacent first holes 9 may be increased so that the first holes 9 are distributed sparsely in increments or in stages toward a k5 direction (the +X direction) from the left peripheral edge part 1EdL side in a perspective plan view of the back surface 10b, for example. Herein, in a perspective plan view of the back surface 10b, for example, the description of "toward the k5 direction (the +X direction) from the left peripheral edge part 1EdL side in the region d3" indicates "closer to the region where the tertiary third electrode 8c3 is located in the region d3".

Furthermore, if the third electrode 8c includes the plurality of island shaped portions, for example, the passivation layer 4 may include a part where the ratio of the area occupied by the plurality of first holes 9 per unit area decreases with a decreasing distance to the island shaped portions in the +Y direction in a perspective plan view of the back surface 10b. In other words, there may be a region where the contact area between the first electrodes 8a and the second electrodes 8b per unit area decreases with the decreasing distance to the island shaped portions in a perspective plan view of the back surface 10b, for example. Herein, the connection tab connected to the third electrode 8c is connected to the third electrode 8c along the +Y direction (or the −Y direction). A direction of electricity from the solar cell element 10 to the connection tab is thereby the +Y direction (or the −Y direction). Thus, the distance between the centers of the adjacent first holes 9 may be increased so that the first holes 9 are distributed sparsely in increments or in stages toward the k3 direction (the +Y direction) in the region d1, for example. Herein, the k3 direction is a direction from an end d1a side which is a side of the region d1 in the −Y direction toward an end d1b side which is a side of the region d1 in the +Y direction located on an opposite side of an end d1a. Accordingly, the serial resistance component in the equivalent circuit in the solar cell element 10 can be reduced, for example. As a result, the photoelectric conversion efficiency of the solar cell element 10 can be increased.

The passivation layer 4 may include a part where the ratio of the area occupied by the plurality of first holes 9 per unit area decreases with a decreasing distance to the third electrode 8c between both ends of the third electrode 8c in a longitudinal direction and the peripheral edge part 1Ed of the substrate 1 in a perspective plan view of the back surface 10b, for example. Assumed herein as illustrated in FIG. 2 is a case where the third electrode 8c has a first end E1 on a side in the −Y direction and a second end E2 on a side opposite to the first end E1 (a side in the +Y direction) in the longitudinal direction (the ±Y direction herein). In this case, as illustrated in FIG. 4, the passivation layer 4 may include a part where the ratio of the area occupied by the plurality of first holes 9 decreases with a decreasing distance to the third electrode 8c between a region where the first end E1 is located and an upper peripheral edge part in the longitudinal direction of the third electrode 8c in a perspective plan view of the back surface 10b, for example. Herein, the upper peripheral edge part 1EdU is a part located close to the first end E1 in the peripheral edge part 1Ed of the substrate 1. The passivation layer 4 may include a part where the ratio of the area occupied by the plurality of first holes 9 decreases with a decreasing distance to the third electrode 8c between a region where the second end E2 is located and a lower peripheral edge part 1EdB in the longitudinal direction of the third electrode 8c in a perspective plan view of the back surface 10b, for example. Herein, the lower peripheral edge part 1EdB is a part located close to the second end E2 in the peripheral edge part 1Ed of the substrate 1.

In another respect, the passivation layer 4 may include a part where the ratio of the area occupied by the plurality of first holes 9 decreases with a decreasing distance to the third electrode 8c between a first part En1 where the first end E1 is located and the upper peripheral edge part 1EdU in the longitudinal direction of the region where the third electrode 8c is located in a perspective plan view of the back surface 10b, for example. The passivation layer 4 may include a part where the ratio of the area occupied by the plurality of first holes 9 decreases with a decreasing distance to the third electrode 8c between a second part En2 where the second end E2 is located and the lower peripheral edge part 1EdB in the longitudinal direction of the region where the third electrode 8c is located in a perspective plan view of the back surface 10b, for example. In other words, there may be a region where the contact area between the first electrodes 8a and the second electrodes 8b per unit area decreases with the decreasing distance to the third electrode 8c in a perspective plan view of the back surface 10b, for example.

As illustrated in FIG. 4, for example, a region d4 is located between a peripheral edge part (an upper peripheral edge part) 1EdU located in a −Y direction side of the substrate 1 and a region where the secondary third electrode 8c2 is located in a perspective plan view of the back surface 10b, for example. Also in the region d4, the distance between the centers of the adjacent first holes 9 may be decreased so that the first holes 9 are distributed sparsely in increments or in stages from an upper peripheral edge part 1EdU side toward a k6 direction (the +Y direction) directed to a region side where the secondary third electrode 8c2 is located, for example. As illustrated in FIG. 4, for example, the distance between the centers of the adjacent first holes 9 increases so that the first holes 9 are distributed sparsely in increments or in stages toward a k7 direction (the −Y direction) also in a region between a peripheral edge part (a lower peripheral edge part) 1EdB of the substrate 1 in the +Y direction and a region where the third electrode 8c is located in a perspective plan view of the back surface 10b. Accordingly, the serial resistance component in the equivalent circuit in the solar cell element 10 can be reduced. As a result, the photoelectric conversion efficiency of the solar cell element 10 can be increased.

As illustrated in FIG. 4, for example, the plurality of first holes 9 may be located to be evenly distributed in a region d5 between the peripheral edge part 1Ed of the substrate 1 and the end d1b of the region d1 and a region d6 between the peripheral edge part 1Ed of the substrate 1 and the end of the region d2 in the +Y direction. However, for example, the first holes 9 may be distributed sparsely in increments or in stages with a decreasing distance to the second end E2 of the third electrode 8c. Specifically, the plurality of first holes 9 may be distributed sparsely in increments or in stages in a direction close to a nearest end of the third electrode 8c (also referred to as a k8 direction) in regions between the lower peripheral edge part 1EdB located in the peripheral edge part 1Ed of the substrate 1 in the +Y direction and the regions d1, d2, and d3, for example. Similarly, the plurality of first holes 9 may be distributed sparsely in increments or in stages in a direction close to a nearest end of the third electrode 8c (the k8 direction) in regions between the upper peripheral edge part 1EdU located in the peripheral edge part 1Ed of the substrate 1 in the −Y direction and the regions d1, d2, and d3, for example.

In the solar cell element 10 in which a polycrystalline silicon substrate having a square shape with sides of approximately 150 mm to 160 mm is used, the contact area between the first electrodes 8a and the second electrodes 8b per unit area is set to a value described hereinafter in a repeated experiment performed by the inventors. The contact area in the central part of the region d1 in the +X direction in a part on the end d1a side of the region d1 is set to approximately 6 mm$^2$/cm$^2$ to 15 mm$^2$/cm$^2$. The contact area in a part nearest to the third electrode 8c in the k1 direction (the +X direction) or the k2 direction (the −X direction) in the part on the end d1a side of the region d1 is set to approximately 2 mm$^2$/cm$^2$ to 5.9 mm$^2$/cm$^2$. The contact area in the central part of the region d1 in the +X direction in the part on the end d1b side of the region d1 is set to approximately 2 mm$^2$/cm$^2$ to 5.9 mm$^2$/cm$^2$. The contact area in a part nearest to the third electrode 8c in the k1 direction (the +X direction) or the k2 direction (the −X direction) in the part on the end d1b side of the region d1 is set to approximately 0.1 mm$^2$/cm$^2$ to 1.9 mm$^2$/cm$^2$.

The contact area between the first electrodes 8a and the second electrodes 8b per unit area in the solar cell element 10 can be measured in the following manner. For example, firstly, the part on back surface 10b side of the solar cell element 10 is ground with an abrasive paper or the like to remove the second electrode 8b. The end of the first electrode 8a being in contact with the second electrode 8b is thereby exposed. Then, an area of the exposed end of the first electrode 8a is measured using an optical microscope or the like. It is also applicable, for example, to immerse the solar cell element 10 into a hydrochloric acid solution having a concentration of approximately 5% to 30% by mass and dissolve the first electrode 8a and the second electrode 8b to expose the passivation layer 4 made of aluminum oxide, and measure the area of the first hole 9 using an optical microscope or the like.

<1-2. Method of Manufacturing Solar Cell Element>

Next, each process of the method of manufacturing the solar cell element 10 is described.

Figure 6A:
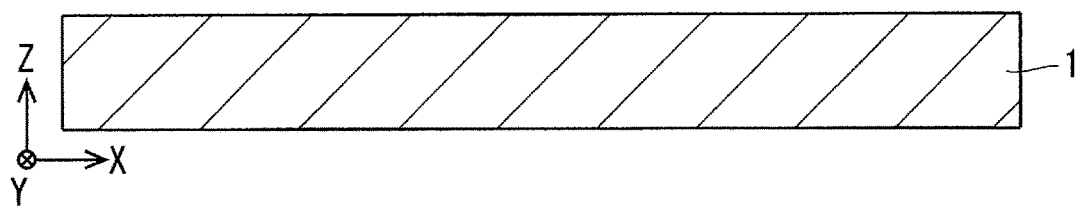
FIG. 6A to FIG. 6F illustrate end views for describing a method of manufacturing the solar cell element according to the first embodiment.

Firstly, the substrate 1 is prepared as illustrated in FIG. 6A. The substrate 1 may be made of a monocrystalline silicon or a polycrystalline silicon, for example. The substrate 1 is formed by an existing Czochralski (CZ) method, casting method or the like, for example. Described hereinafter is an example of using the p-type polycrystalline silicon substrate as the substrate 1. For example, an ingot of the polycrystalline silicon is prepared by the casting method herein. Electrical resistivity of the ingot may range from 1 Ω·cm to 5 Ω·cm, for example. Herein, boron may be added to the polycrystalline silicon as a dopant element, for example. Next, the ingot of the polycrystalline silicon is sliced using a wire saw device to obtain the plurality of substrates 1. The substrate 1 has a front surface and a back surface each having a square shape with sides of approximately 160 mm in length and a thickness of approximately 200 μm, for example. Subsequently, if a small amount of etching is performed on the whole front surface and back surface of the substrate 1 with a solution of sodium hydroxide (NaOH), potassium hydroxide (KOH), hydrofluoric-nitric acid or the like, for example, a mechanical damage layer and a contamination layer occurred in slicing the substrate 1 can be removed.

Figure 6B:
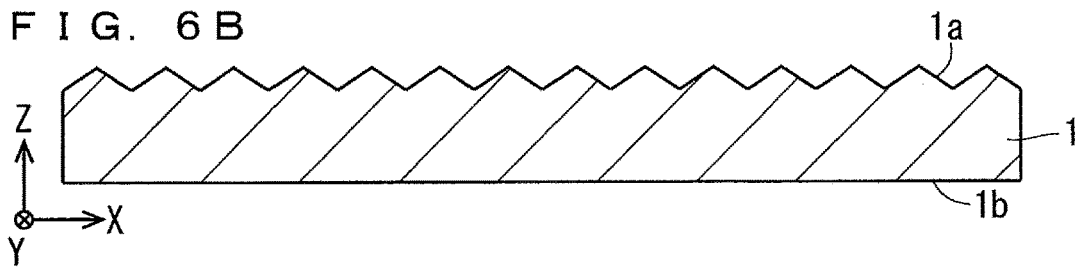

As illustrated in FIG. 6B, a texture may be formed on the first surface 1a of the substrate 1 to reduce a reflection of light. The texture can be formed by wet etching using an alkaline solution of NaOH and the like or an acid solution of hydrofluoric-nitric acid and the like, dry etching using reactive ion etching (RIE) method or the like, for example.

Figure 6C:
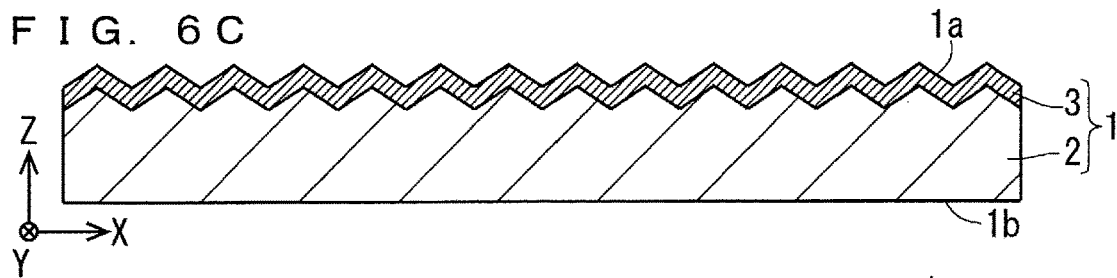

Next, as illustrated in FIG. 6C, the n-type second semiconductor layer 3 is formed in a surface layer portion on the first surface 1a side of the substrate 1 having the texture. The second semiconductor layer 3 can be formed by application thermal diffusion method, gas phase thermal diffusion method, or the like, for example. The application thermal diffusion method is, for example, a method in which a diphosphorus pentaoxide (P$_2$O$_5$) paste is applied on the first surface 1a of the silicon substrate 1, and phosphorus is thermally diffused in the surface layer portion on the first surface 1a side of the substrate 1. The gas phase thermal diffusion method is, for example, a method in which a phosphorus oxychloride ($POCl_3$) gas is used as a diffusion source of phosphorus. The second semiconductor layer 3 is formed to have a thickness of approximately 0.1 μm to 2 μm and a sheet resistance of approximately 40Ω/□ to 200Ω/□. Herein, in the gas phase thermal diffusion method, the substrate 1 is heat treated in an atmosphere of a diffused gas made of $POCl_3$ and the like at a temperature of approximately 600° C. to 800° C. for approximately 5 minutes to 30 minutes to form phosphorus silicate glass (also referred to as PSG) on the surface of the substrate 1, for example. The substrate 1 is then heat treated in an atmosphere of an inert gas such as argon or nitrogen at a high temperature of approximately 800° C. to 900° C. for approximately 10 minutes to 40 minutes, for example. Accordingly, phosphorus is diffused from the PSG to the surface layer portion of the substrate 1, and the second semiconductor layer 3 is thereby formed in the surface layer portion on the first surface 1a side of the substrate 1.

If the second semiconductor layer 3 is also formed on the second surface 1b side in the process of forming the second semiconductor layer 3, the second semiconductor layer 3 formed on the second surface 1b side is removed by etching. The p-type first semiconductor layer 2 is thereby exposed on the second surface 1b side of the substrate 1. At this time, the second semiconductor layer 3 formed on the second surface 1b side is removed by immersing the second surface 1b of the substrate 1 in a hydrofluoric-nitric acid solution, for example. Subsequently, the PSG adhered to the first surface 1a side of the substrate 1 at the time of forming the second semiconductor layer 3 is removed by etching. At this time, the second semiconductor layer 3 formed on a side surface of the substrate 1 may also be removed.

Figure 6D:
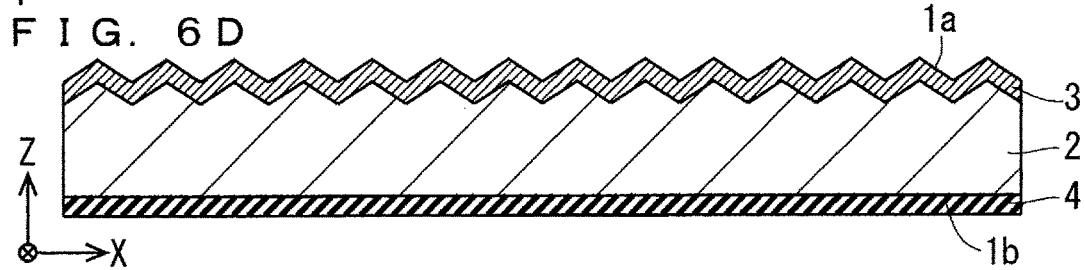

Next, as illustrated in FIG. 6D, the passivation layer 4 made of aluminum oxide, for example, is formed on the first semiconductor layer 2 on the second surface 1b side. ALD method, PECVD method or the like can be adopted as a method of forming the passivation layer 4, for example. Herein, if the ALD method is adopted, a coverage rate (a coverage) by the passivation layer 4 on the second surface 1b of the substrate 1 is increased, for example. A passivation effect by the passivation layer 4 can be thereby enhanced.

In forming the passivation layer 4 by the ALD method, the substrate 1 in which the second semiconductor layer 3 has been formed is disposed in a chamber of a layer formation apparatus firstly. Then, processes A to D described hereinafter are repeated several times in a state where the substrate 1 is heated at a temperature ranging from 100° C. to 250° C. The passivation layer 4 made of aluminum oxide with a desired thickness can be thereby formed on the substrate 1. The following is contents of the processes A to D.

[Process A] An aluminum material, such as trimethylaluminum (TMA), for formation of aluminum oxide is supplied on the substrate 1 in the chamber of the layer formation apparatus along with a carrier gas such as an Ar gas or a nitrogen gas. The aluminum material is thereby absorbed onto an entire periphery of the substrate 1. A length of time to supply TMA may be approximately 15 to 3000 milliseconds, for example.

[Process B] The inside of the chamber of the layer formation apparatus is purified with a nitrogen gas. The aluminum material in the chamber is thereby removed. At this time, further removed is the aluminum material other than a constituent which is chemically absorbed at an atomic layer level in the aluminum material which is physically absorbed and chemically absorbed onto the substrate 1. Herein, a length of time for purifying the inside of the chamber with the nitrogen gas may be approximately one second to several tens of seconds, for example.

[Process C] An oxidizer such as water or an ozone gas is supplied into the chamber of the layer formation apparatus. At this time, the alkyl group contained in TMA is removed so that the OH group is substituted for the alkyl group. Accordingly, the atomic layer of aluminum oxide is formed on the substrate 1. A length of time for supply the oxidizer into the chamber may be, for example, approximately 500 to 1500 milliseconds. Herein, hydrogen atoms are easily included in the aluminum oxide layer, which has been formed, by supplying the hydrogen atoms along with the oxidizer into the chamber.

[Process D] The inside of the chamber of the layer formation apparatus is purified with a nitrogen gas. The oxidizer in the chamber is thereby removed. At this time, the oxidizer which has not contributed to a reaction at the time of forming aluminum oxide at the atomic layer level on the substrate 1 is removed, for example. Herein, a length of time for purifying the inside of the chamber with the nitrogen gas may be approximately one second to several tens of seconds, for example.

Subsequently, the aluminum oxide layer having a desired layer thickness of approximately 6 nm to 200 nm, for example, can be formed by repeating a series of processes of the process A to the process D several times.

Although the case of forming aluminum oxide using TMA as the aluminum material is described herein, the other material may be used as the aluminum material. Applicable is a material which has an appropriate steam pressure of 100 Pa or higher as a gas supply source and can be supplied to the inside of the chamber in a gas state at a material supply temperature which can be set to range from −20° C. to 120° C., for example. For example, triethylaluminum (TEA) or the like can be adopted as the other material. As described above, the passivation layer 4 can also be formed on the entire periphery of the substrate 1 including the side surface of the substrate 1 in addition to the second surface 1b of the first semiconductor layer 2 as the p-type semiconductor region by using the ALD method. In this case, it is applicable to form an acid-resisting layer or the like by application on the passivation layer 4 formed on the second surface 1b of the substrate 1, and subsequently removing the unnecessary passivation layer 4 with hydrofluoric acid or the like by etching.

Figure 6E:
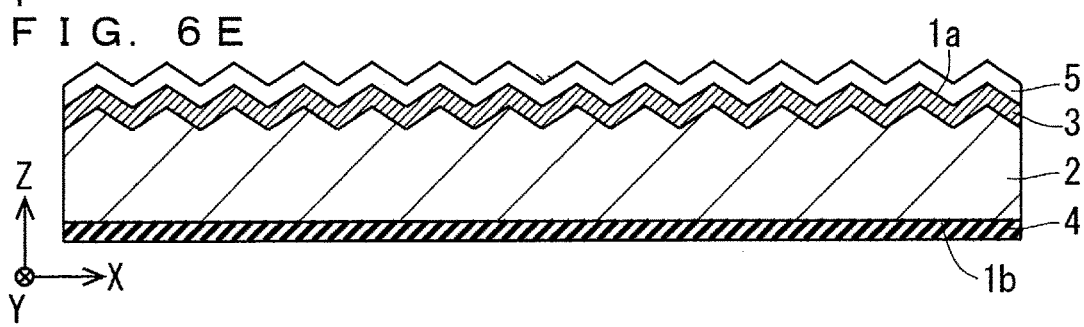

Next, as illustrated in FIG. 6E, the antireflection layer 5 including a silicon nitride layer is formed on the first surface 1a side of the substrate 1, for example. The antireflection layer 5 can be formed using PECVD method, sputtering method or the like, for example. When the PECVD method is applied, the substrate 1 is previously heated at a higher temperature than a temperature in forming the layer on the substrate 1, for example. Subsequently, a mixed gas of silane ($SiH_4$) and ammonia ($NH_3$) is diluted by nitrogen ($N_2$), and is then supplied to the heated substrate 1, for example. Then, the component of the mixed gas is plasmatized by glow discharge decomposition at a reaction pressure in the chamber within a range from 50 Pa to 200 Pa and deposited on the first surface 1a, thereby forming the antireflection layer 5, for example. Herein, a layer formation temperature may range approximately from 350° C. to 650° C., for example. A frequency of a high-frequency power source necessary for the glow discharge may range approximately from 10 kHz to 500 kHz, for example. A flow rate of the gas supplied to the chamber is appropriately determined in accordance with a size of the chamber and the like. The flow rate of the gas supplied to the chamber may range from 150 sccm to 6000 sccm, for example. At this time, a ratio (=B/A) of the flow rate B of ammonia to the flow rate A of silane may be approximately 0.5 to 15, for example.

Figure 6F:
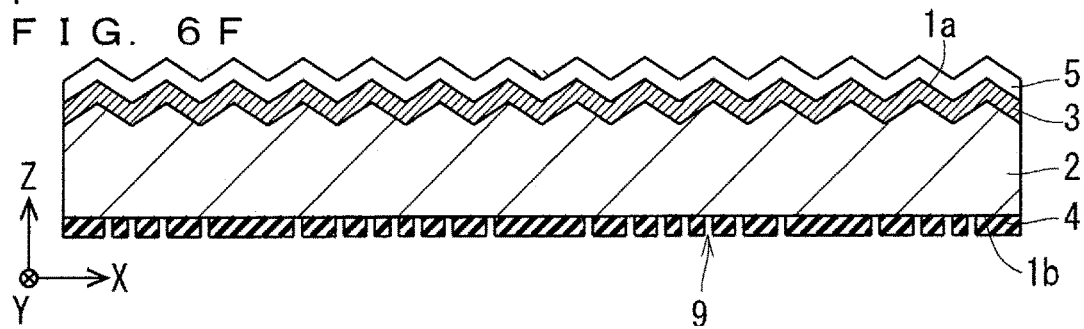

Next, the plurality of first holes 9 are fouled in the passivation layer 4 as illustrated in FIG. 6F. Herein, for example, the plurality of first holes 9 can be formed in a pattern illustrated in FIG. 4 by irradiating the second surface 1b side of the substrate 1 with a laser beam using a laser device. A neodymium-doped yttrium aluminum garnet (Nd: YAG) laser with Q switch (laser beam wavelength 1064 nm), a second harmonic of the Nd:YAG laser (SHG, laser beam wavelength 532 nm) or the like can be used for the laser device. For example, if the second harmonic of the Nd:YAG laser with Q switch is used, a condition where an oscillating frequency is 10 kHz, an output ranges from 7 W to 10 W, and a beam diameter is approximately 100 µm can be adopted. Herein, for example, it is also applicable that the first hole 9 is not formed in a position where the third electrode 8c is to be formed.

Figure 7G:
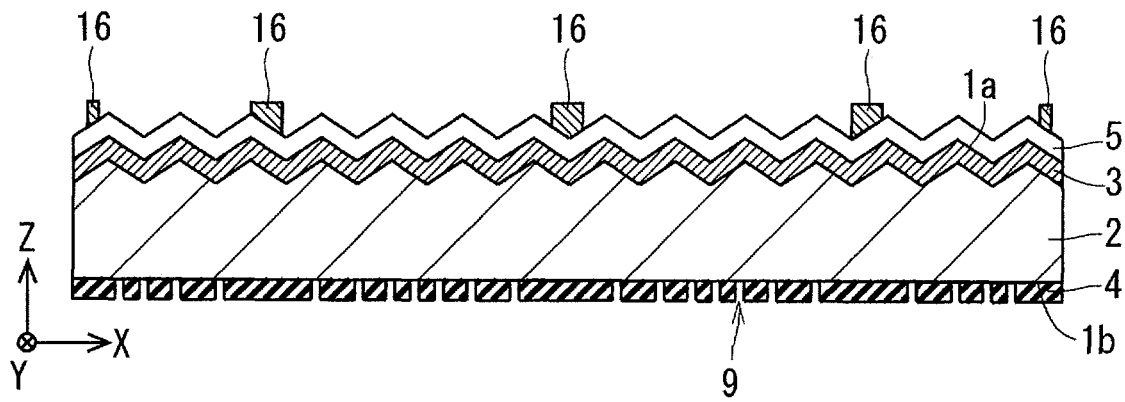
FIG. 7G to FIG. 7I illustrate end views for describing a method of manufacturing the solar cell element according to the first embodiment.
Figure 7H:
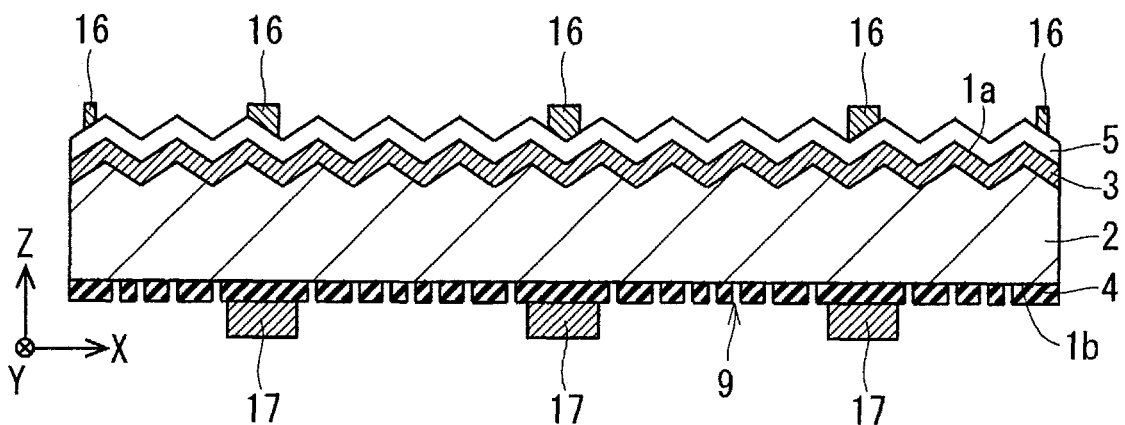
Figure 7I:
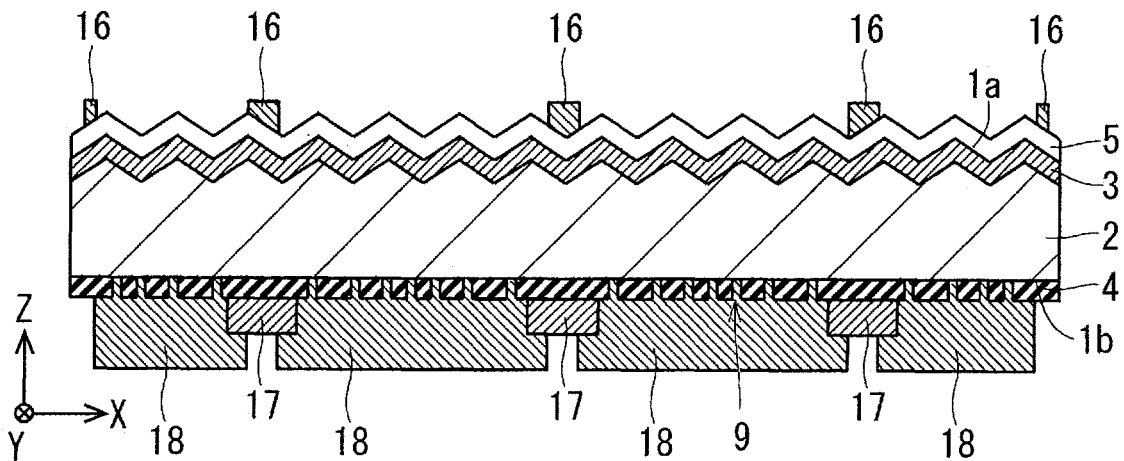

Next, as illustrated in FIG. 7G to FIG. 7I, the surface electrode 7 (the bus bar electrode 7a, the finger electrode 7b, and the sub-finger electrode 7c) and the back surface electrode 8 (the first electrode 8a, the second electrode 8b, and the third electrode 8c) are formed in a manner described hereinafter.

First, as illustrated in FIG. 7G, the surface electrode 7 is formed using a first paste 16. Adopted herein is a conductive paste containing a metal powder including silver as a main component, for example, as the first paste 16. The metal powder may be made up of a silver powder in which a main metal component has a particle diameter of approximately 0.05 µm to 20 µm or approximately 0.1 µm to 5 µm, for example. A contained amount of silver contained in the metal powder may be approximately 65% to 85% by mass of total mass of the conductive paste. The first paste 16 further contains an organic vehicle and a glass frit, for example. Herein, a concentration of the organic vehicle in the first paste 16 may be approximately 5% to 15% by mass of the total mass of the conductive paste, for example. A concentration of the glass frit in the first paste 16 may be approximately 0.05% to 10% by mass of the total mass of the conductive paste, for example. Herein, the first paste 16 is firstly applied on the first surface 1a side of the substrate 1 using a screen printing to have a pattern illustrated in FIG. 1. Then, processing of evaporating a solvent at a predetermined temperature to dry the applied first paste 16, for example, is performed on the applied first paste 16.

Next, as illustrated in FIG. 7H, the third electrode 8c of the back surface electrode 8 is formed using a second paste 17. Adopted herein is a conductive paste containing a silver powder, an organic vehicle, and a glass frit as main components, for example, as the second paste 17. The second paste 17 may be similar to the first paste 16 described above. The screen printing method or the like, for example, can be adopted as a method of applying the second paste 17. Herein, processing of evaporating a solvent at a predetermined temperature to dry the second paste 17 is performed on the second paste 17 after applying the second paste 17 on the passivation layer 4, for example.

Furthermore, as illustrated in FIG. 7I, the first electrode 8a and the second electrode 8b are formed using a third paste 18. Adopted herein is a conductive paste containing a metal powder including aluminum as a main component, for example, as the third paste 18. The metal powder may be made up of an aluminum powder in which a main metal component has a particle diameter of approximately 0.05 µm to 20 µm or approximately 0.1 µm to 5 µm, for example. A contained amount of aluminum contained in the metal powder may be approximately 65% to 80% by mass of total mass of the conductive paste. The third paste 18 further contains an organic vehicle and a glass frit, for example. Herein, a concentration of the organic vehicle in the third paste 18 may be approximately 5% to 15% by mass of the total mass of the conductive paste, for example. A concentration of the glass frit in the third paste 18 may be approximately 0.05% to 10% by mass of the total mass of the conductive paste, for example. Herein, the third paste 18 is firstly applied on the second surface 1b side of the substrate 1 to cover the first holes 9 which have been formed already. At this time, if the third paste 18 is applied on substantially an entire surface of an area on the second surface 1b side of the substrate 1 where the third electrode 8c is to be not formed, the inside of the first holes 9 can be filled with the third paste 18 without a rigorous alignment. The screen printing method or the like, for example, can be adopted as a method of applying the third paste 18. Processing of evaporating a solvent at a predetermined temperature to dry the applied third paste 18 may be performed on the applied third paste 18.

Subsequently, the substrate 1 on which the first paste 16, the second paste 17, and the third paste 18 have been applied is sintered in a baking furnace in a state that a maximum temperature of approximately 700° C. to 950° C. is kept for approximately several tens of seconds to several tens of minutes. Accordingly, each conductive paste (the first paste 16, the second paste 17, and the third paste 18) is sintered. Accordingly, as illustrated in FIG. 3, the surface electrode 7 (the bus bar electrode 7a, the finger electrode 7b, and the sub-finger electrode 7c) and the back surface electrode 8 (the first electrode 8a, the second electrode 8b, and the third electrode 8c) are formed. The first paste 16 passes through the antireflection layer 5 at the time of the sintering. The surface electrode 7 is thereby formed to be connected to the n-type second semiconductor layer 3 on the first surface 1a side of the substrate 1. The first electrode 8a is formed by performing the sintering on the third paste 18 filled in the inside of the first hole 9. At this time, the BSF layer 13 is formed in a surface layer portion of the second surface 1b of the substrate 1 in accordance with the formation of the first electrode 8a. Furthermore, the second electrode 8b is formed by performing the sintering on the third paste 18 applied on the second surface 1b side of the substrate 1 to cover the first holes 9. Furthermore, the third electrode 8c is formed by performing the sintering on the second paste 17. At this time, the third electrode 8c may be formed on the passivation layer 4 without second paste 17 passing through the passivation layer 4 by the sintering, or the third electrode 8c may be formed on the first semiconductor layer 2 with the second paste 17 passing through the passivation layer 4 by the sintering. Herein, for example, a component of the glass frit in the second paste 17 is appropriately adjusted, thus it can be controlled whether or not the second paste 17 passes through the passivation layer 4. For example, a glass fit of $SiO_2$—$BiO_3$—$PbO$ system can be applied to the glass fit to make the second paste 17 pass through the passivation layer 4. In the meanwhile, for example, a glass frit of $B_2O_3$—$SiO_2$—$ZnO$ system can be applied to the glass frit not to make the second paste 17 pass through the passivation layer 4.

<1-3. Solar Cell Module>

As illustrated in FIG. 8A and FIG. 8B, the solar cell module 20 includes a solar cell panel 23 including the plurality of solar cell elements 10 and a frame 24 located on an outer peripheral part of the solar cell panel 23. The solar cell module 20 includes a first module surface 20a which is a surface which mainly receives light and a second module surface 20b corresponding to a back surface of the first module surface 20a. The solar cell module 20 includes a terminal box 25 on the second module surface 20b as illustrated in FIG. 8B. An output cable 26 for supplying electrical power generated in the solar cell module 20 to an external circuit is wired to the terminal box 25.

Figure 9A:
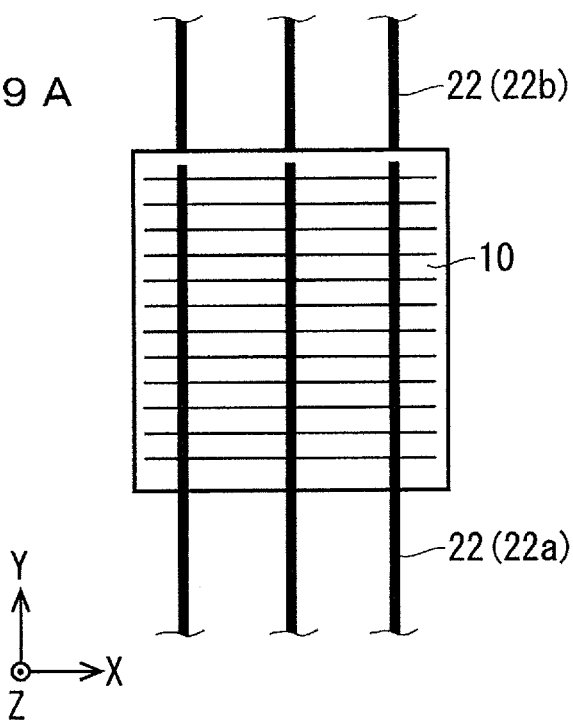
FIG. 9A illustrates a plan view showing one example of a solar cell element to which a connection tab is connected.
Figure 9B:
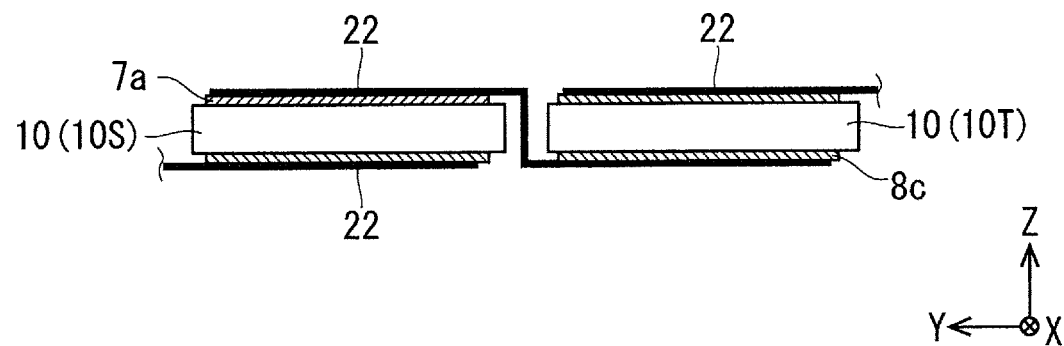
FIG. 9B illustrates an end view showing one example of two solar cell elements connected to each other by a connection tab.

The solar cell element 10 according to the first embodiment described above is applied to the solar cell element 10 constituting the solar cell module 20, for example. Herein, the solar cell elements 10 adjacent to each other in the solar cell module 20 are electrically connected to each other via the connection tab 22 as illustrated in FIG. 9A and FIG. 9B. A metallic foil of copper or aluminum having a thickness of approximately 0.1 mm to 0.3 mm, for example, is applied to the connection tab 22. A solder coats a surface of the metallic foil, for example. The solder can be formed to have an average thickness of approximately 5 µm to 30 µm, for example, by plating or dipping. A width of the connection tab 22 may be equal to or smaller than that of the bus bar electrode 7a of the solar cell element 10, for example. Accordingly, the connection tab 22 hardly blocks the solar cell element 10 from receiving the light. The connection tab 22 may be connected to substantially the entire surface of the bus bar electrode 7a and the third electrode 8c. Accordingly, the resistance component in the solar cell element 10 can be reduced. Herein, if the substrate 1 which has a front surface and a back surface each having substantially a square shape with sides of approximately 160 mm in length is used, for example, the connection tab 22 having a width of approximately 1 mm to 3 mm and a length of approximately 260 mm to 320 mm can be adopted.

As illustrated in FIG. 9A, a first connection tab 22a in the plurality of connection tabs 22 connected to one solar cell element 10 is soldered on the bus bar electrode 7a on the front surface 10a of the solar cell element 10. A second connection tab 22b in the plurality of connection tabs 22 is soldered on the third electrode 8c on the back surface 10b of the solar cell element 10.

Herein, as illustrated in FIG. 9B, the solar cell elements 10 (solar cell elements 10S and 10T) adjacent to each other are connected to each other via the connection tab 22. Specifically, the connection tab 22 includes, in a longitudinal direction, one end portion which is solder connected to the bus bar electrode 7a on the front surface 10a of the solar cell element 10S and the other end portion which is solder connected to the third electrode 8c on the back surface 10b of the solar cell element 10T, for example. Such a connection is repeatedly provided between the plurality of (approximately five to ten, for example) solar cell elements 10. That is to say, there is a solar cell string having the plurality of solar cell elements 10 linearly connected in series.

Figure 10:
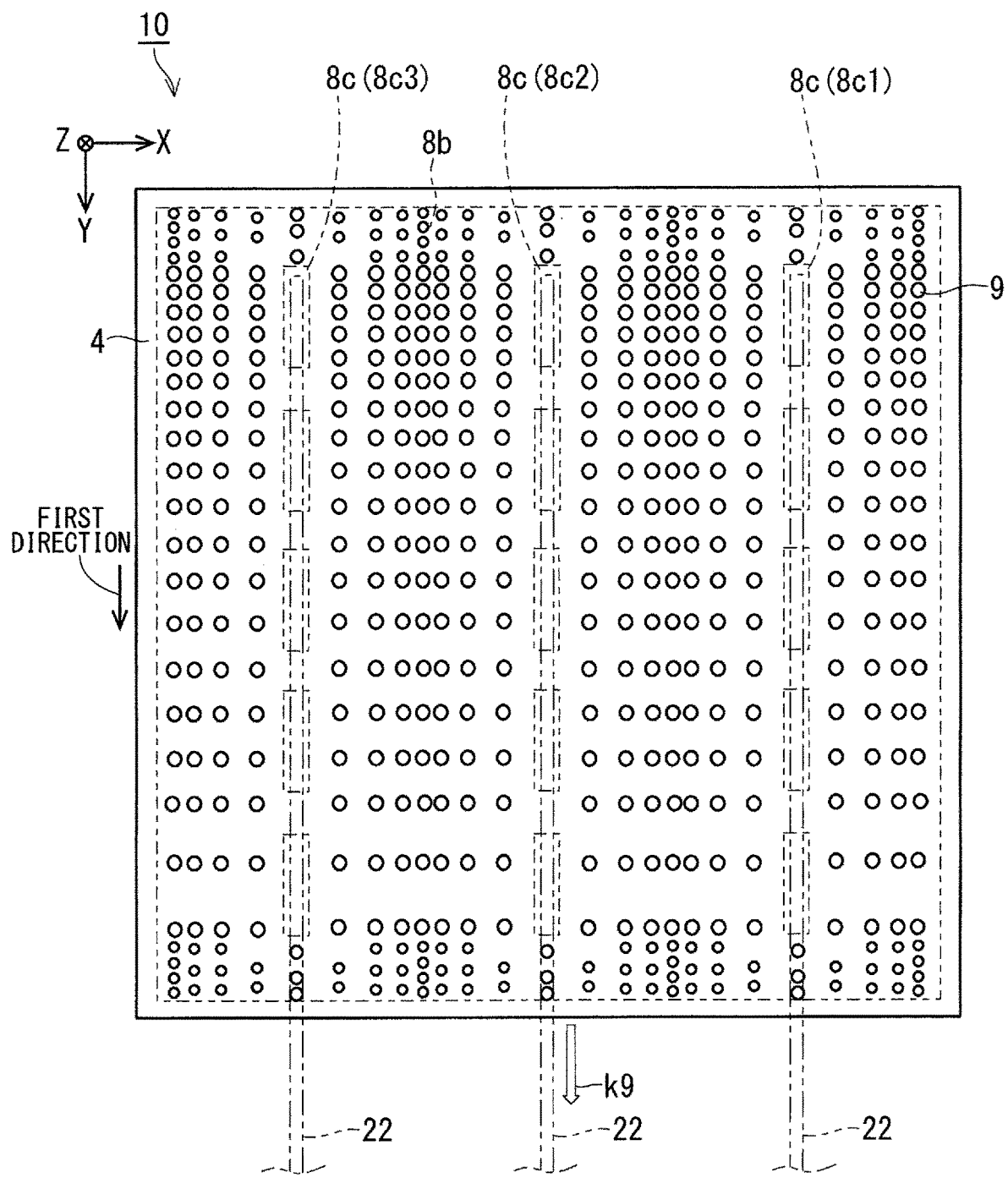
FIG. 10 illustrates a perspective plan view showing a relationship between the distribution of the first holes in the passivation layer and a position of the connection tab according to the first embodiment.

Herein, the solar cell module 20 includes the connection tab 22 located to extend toward the first direction on the third electrode 8c, for example. As described above, the passivation layer 4 includes the part where the ratio of the area occupied by the plurality of first holes 9 in the first region A1 adjacent to the third electrode 8c is smaller than the ratio of the area occupied by the plurality of first holes 9 in the second region A2 located farther away from the third electrode 8c in relation to the first region A1 and having the area equal to that of the first region A1 in a perspective plan view. In other words, the contact area between the first electrodes 8a and the second electrodes 8b per unit area decreases with the decreasing distance to the island shaped portions of the third electrode 8c toward the first direction (the +Y direction), for example. For example, as illustrated in FIG. 10, the plurality of first holes 9 are most densely distributed on an end side located on the −Y direction side in the first direction (the +Y direction), and the plurality of first holes 9 are distributed sparsely toward the first direction in a perspective plan view of the passivation layer 4. In contrast, if a direction of the connection tab 22 extending toward the adjacent solar cell element 10 is the first direction (a k9 direction) in the solar cell module 20, the current flows in the connection tab 22 in the first direction. If the plurality of first holes 9 have the distribution described in this case, for example, the serial resistance of the solar cell module 20 is reduced, and the photoelectric conversion efficiency of the solar cell module 20 can be increased.

As illustrated in FIG. 8A, the solar cell module 20 comprises a plurality of (for example, approximately two to ten) solar cell strings described above. Herein, the plurality of solar cell strings are aligned substantially in parallel with each other at a predetermined interval of approximately 1 mm to 10 mm, for example. Each of the solar cell elements 10 located on each end of the plurality of solar cell strings are electrically connected to each other by a soldering of a lateral direction wiring 27, for example. Accordingly, the plurality of solar cell elements 10 constituting the plurality of solar cell strings are electrically connected to each other in series, for example. In the plurality of solar cell strings, an external leading wiring 32 (refer to FIG. 11) is connected to each of the two solar cell elements 10 located at the both ends and electrically connected to each other in series in the plurality of solar cell elements 10.

The solar cell module 20 includes a solar cell panel 23 in which a translucent substrate 28, a front surface side filler 29, the plurality of solar cell strings, a back surface side filler 30, and a back surface member 31 are laminated. The solar cell panel 23 is formed in the following manner, for example.

Firstly, the translucent substrate 28, the front surface side filler 29, the back surface side filler 30, and the back surface member 31 are prepared.

The translucent substrate 28 is made up of glass having translucency, for example. Herein, a super white glass, a toughened glass, a double-strength glass, or a heat reflecting glass, for example, having a thickness of approximately 3 mm to 5 mm is used for the glass.

Each of the front surface side filler 29 and the back surface side filler 30 is made of ethylene vinyl acetate copolymer (EVA) or polyvinyl butyral (PVB), for example. A sheet like member with a thickness of approximately 0.4 mm to 1 mm formed by a T-die and a push bench, for example, is used for the front surface side filler 29 and the back surface side filler 30.

The back surface member 31 has a role of reducing a water infiltration from outside, for example. A weather resistance fluorine contained resin sheet with an aluminum foil therein, polyethylene terephthalate (PET) on which alumina or silica is evaporated of the like, for example, is used for the back surface member 31. Herein, if the light entering from the second module surface 20b side of the solar cell module 20 is used for power generation, for example, the back surface member 31 may be made up of glass or a polycarbonate resin having translucency, for example.

Figure 11:
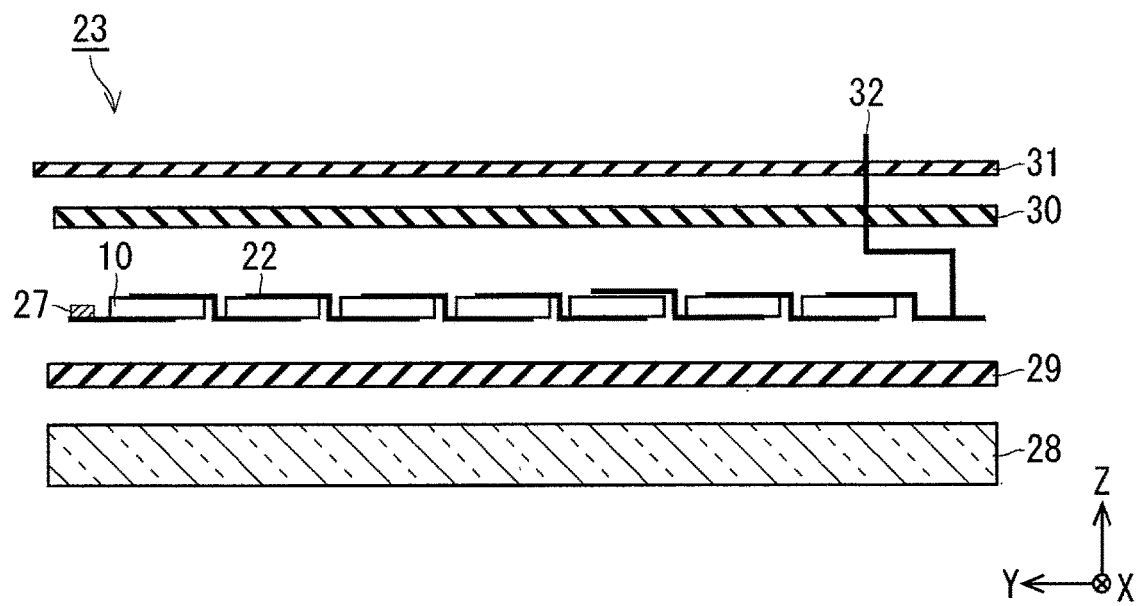
FIG. 11 illustrates an exploded end view showing an exploded solar cell panel constituting the solar cell module according to the first embodiment.

Subsequently, as illustrated in FIG. 11, after the front surface side filler 29 is disposed on the translucent substrate 28, the plurality of solar cell strings to which the plurality of solar cell elements 10 are connected as described above, the back surface side filler 30, and the back surface member 31 are sequentially laminated to manufacture a laminated body.

Subsequently, the laminated body is set in a lamination device. Then, under reduced pressure, the laminated body is heated for, for example, approximately fifteen minutes to one hour at a temperature ranging from 100° C. to 200° C. with applying pressure, and the solar cell panel 23 can be thereby manufactured.

Then, as illustrated in FIG. 8A and FIG. 8B, the frame 24 is attached to an outer peripheral part of the solar cell panel 23, and the terminal box 25 is attached to the back surface member 31 constituting the second module surface 20b as necessary, thereby the solar cell module 20 is completed.

2. Another Embodiment

The present disclosure is not limited to one embodiment described above, but many modifications and changes can be added within a scope of the present disclosure. For example, in performing the sintering for forming the electrode, the sintering for forming the first electrode 8a and the second electrode 8b may be performed separately after performing the sintering for forming the surface electrode 7 and the third electrode 8c of the back surface electrode 8 which have the similar component.

2-1. Second Embodiment

Figure 12:
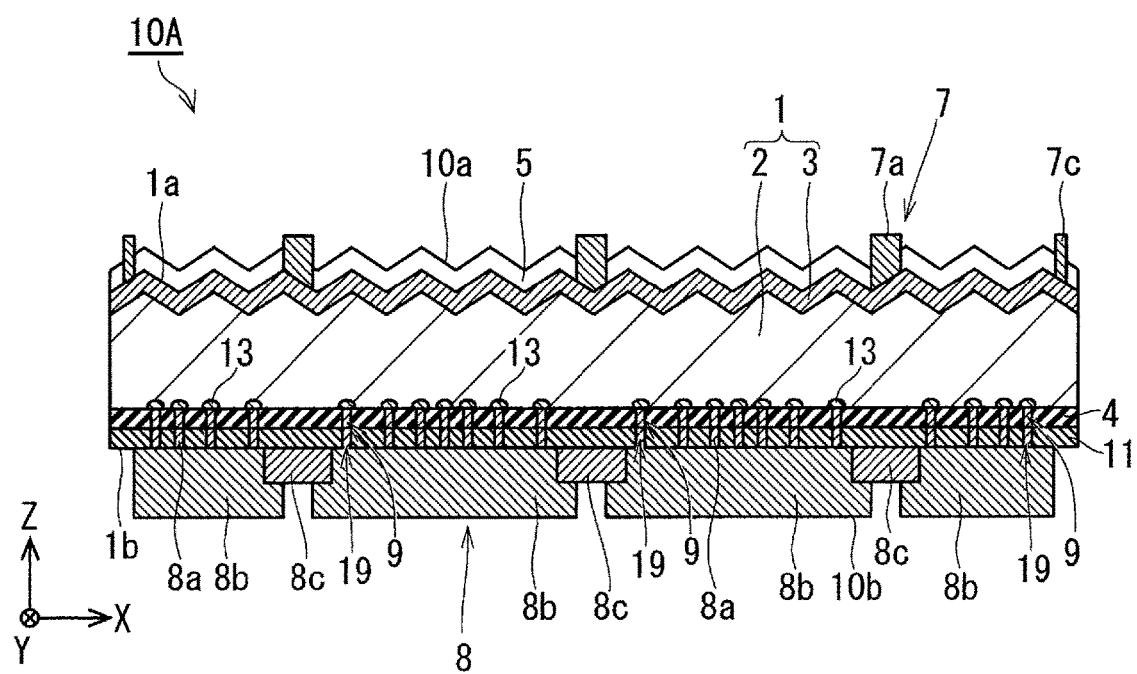
FIG. 12 illustrates an end view showing one example of an end surface corresponding to the end surface of FIG. 3 taken across a solar cell element according to a second embodiment.

For example, as illustrated in FIG. 12, a solar cell element 10A according to the second embodiment further comprising a protection layer 11, based on the solar cell element 10 according to the first embodiment described above, may be adopted. In an example in FIG. 12, the protection layer 11 is located between the passivation layer 4 and the second electrode 8b on the back surface 10b side of the solar cell element 10A. The protection layer 11 has second holes 19 each located on the first hole 9. Thus, the first hole 9 and the second hole 19 are communicated with each other to form one through hole. The first electrode 8a is also located in the second hole 19 in addition to the inside of the first hole 9. In other words, the first electrode 8a is located from the inside of the first hole 9 to the inside of the second hole 19.

The protection layer 11 is made up of a silicon nitride Mayer, a silicon oxide layer or the like, for example. For example, a silicon nitride layer having a layer thickness of approximately 2 nm to 15 nm can be formed using PECVD method or sputtering method, for example. For example, a silicon oxide layer having a layer thickness of approximately 2 nm to 15 nm can be formed using PECVD method, for example. For example, in using the silicon nitride layer as the protection layer 11, if the layer thickness of the protection layer 11 is smaller than that of the passivation layer 4, a negative fixed charge of aluminum oxide constituting the passivation layer 4 becomes dominant over a positive fixed charge of silicon nitride constituting the protection layer 11. Thus, the passivation effect of the passivation layer 4 is hardly reduced.

The solar cell element 10A having the structure described above can be manufactured by forming the protection layer 11 after the process of forming the passivation layer 4 described above in the first embodiment, for example. Herein, for example, the protection layer 11 can be formed on the substrate 1, on which the passivation layer 4 has been formed on the second surface 1b side, in the manner similar to the method of forming the antireflection layer 5 described above, for example. Specifically, a mixed gas of silane and ammonia is diluted by nitrogen gas by PECVD method, and is then supplied on the substrate 1 in the chamber, for example. Then, the component of the mixed gas is plasmatized by glow discharge decomposition at a reaction pressure in the chamber within a range from 50 Pa to 200 Pa and deposited on the substrate 1, thereby being able to form the protection layer 11.

The second hole 19 can be formed by a method similar to the method of forming the first hole 9 in the first embodiment described above, for example. Specifically, the first hole 9 and the second hole 19 can be formed at the same time by irradiating the protection layer 11 with a laser beam, for example.

If there is the protection layer 11, in forming the second electrode 8b, for example, a transformation or breaking of the passivation layer 4 due to a diffusion of aluminum hardly occurs at the time of performing the sintering on the third paste 18 containing aluminum as the main component. With this, a passivation effect of the passivation layer 4 can be maintained.

The invention claimed is:

1. A solar cell element, comprising:
a semiconductor substrate;
a passivation layer being located on the semiconductor substrate and having a plurality of first holes;
a first electrode being located in each of the plurality of first holes and electrically connected to the semiconductor substrate;
a second electrode being electrically connected to the first electrode and located on the passivation layer; and
one or more third electrodes being electrically connected to the first electrode via the second electrode and located to linearly extend in a first direction, wherein
the passivation layer includes a part wherein a first ratio of a first area occupied by the plurality of first holes per unit area in a first region adjacent to the one or more third electrodes is smaller than a second ratio of a second area occupied by the plurality of first holes per unit area in a second region located farther away from the one or more third electrodes in relation to the first region in a perspective plan view, and
wherein a third area of the first region is equal to a fourth area of the second region in the perspective plan view.

2. The solar cell element according to claim 1, further comprising
a protection layer being located between the passivation layer and the second electrode, and having a plurality of second holes being located on the plurality of first holes, wherein
the first electrode is also located in each of the plurality of second hole in addition to an inside of each of the plurality of first holes.

3. The solar cell element according to claim 1, wherein the one or more third electrodes include a plurality of third electrodes being located side by side toward a second direction perpendicular to the first direction.

4. The solar cell element according to claim 1, wherein
the one or more third electrodes include a primary third electrode and a secondary third electrode adjacent to each other, and
the passivation layer includes a part where a third ratio of a fifth area occupied by the plurality of first holes per unit area decreases with a decreasing distance to the primary third electrode or the secondary third electrode in a part between the primary third electrode and the secondary third electrode in the perspective plan view.

5. The solar cell element according to claim 1, wherein
each of the one or more third electrodes includes a plurality of island shaped portions, and
the passivation layer has a part where a third ratio of a fifth area occupied by the plurality of first holes per unit area toward the first direction decreases with a decreasing distance to at least one island shaped portion in the plurality of island shaped portions in the perspective plan view.

6. The solar cell element according to claim 1, wherein each of the one or more third electrodes has a first end and a second end being located on a side opposite to the first end in the first direction, and the passivation layer includes a part where a third ratio of a fifth area occupied by the plurality of first holes per unit area decreases with a decreasing distance to the one or more third electrodes between the first end and a peripheral edge part being located on a side of the first end of the semiconductor substrate and between the second end and a peripheral edge part located on a side of the second end of the semiconductor substrate in the first direction in the perspective plan view.

7. A solar cell module, comprising the solar cell element according to claim 1 and a connection tab being located to extend toward the first direction on the one or more third electrodes.

* * * * *